United States Patent
Bachman, II et al.

(10) Patent No.: US 7,167,693 B2
(45) Date of Patent: Jan. 23, 2007

(54) SCANNING RECEIVER FOR USE IN POWER AMPLIFIER LINEARIZATION

(75) Inventors: Thomas A. Bachman, II, Darlington, MD (US); Robert W. Kooker, Freeland, MD (US); Paul E. White, York, PA (US); Paul Everline, Wildwood, IL (US); Robert Snyder, New Freedom, PA (US); David M. January, Parkton, MD (US); Leonard Sarver, York, PA (US); Philip Shenenberger, Manheim, PA (US)

(73) Assignee: Andrew Corporation, Orland Park, IL (US)

( * ) Notice: Subject to any disclaimer, the term of this patent is extended or adjusted under 35 U.S.C. 154(b) by 322 days.

(21) Appl. No.: 10/942,486

(22) Filed: Sep. 16, 2004

(65) Prior Publication Data

US 2005/0032485 A1    Feb. 10, 2005

Related U.S. Application Data

(62) Division of application No. 10/090,977, filed on Mar. 5, 2002, now abandoned.

(60) Provisional application No. 60/273,659, filed on Mar. 6, 2001.

(51) Int. Cl.
*H04B 1/04* (2006.01)
*H04B 17/02* (2006.01)
*H04B 1/16* (2006.01)

(52) U.S. Cl. ............... 455/127.1; 455/114.3; 455/133; 455/341; 330/151; 370/252

(58) Field of Classification Search ............ 455/127.1, 455/127.2, 127.3, 130, 133, 43, 46, 114.1, 455/114.2, 114.3, 115.1, 150.1, 154.1, 161.1, 455/164.1, 341
See application file for complete search history.

(56) References Cited

U.S. PATENT DOCUMENTS

| | | | |
|---|---|---|---|
| 3,241,078 A | 3/1966 | Jones | 329/50 |
| 3,689,752 A | 9/1972 | Gilbert | 235/194 |
| 4,156,283 A | 5/1979 | Gilbert | 364/841 |

(Continued)

FOREIGN PATENT DOCUMENTS

EP    0 367 457 B1    3/1996

(Continued)

*Primary Examiner*—Tony T. Nguyen
(74) *Attorney, Agent, or Firm*—Wood, Herron & Evans, L.L.P.

(57) ABSTRACT

A feed forward power amplifier system and method identify active channels across a frequency band to suppress unwanted intermodulation distortion (IMD) products in a communications signal such as a single- or multi-carrier communications signal. A scanning receiver identifies at least one active channel in a frequency band, and identifies at least one portion of the frequency band likely to include IMD products based upon the identified active channel(s). Based upon the identified portion of the frequency band, IMD products are suppressed from the communications signal, e.g., by controlling the magnitude and/or phase of a suppression signal mixed with the communications signal.

12 Claims, 4 Drawing Sheets

U.S. PATENT DOCUMENTS

| | | | |
|---|---|---|---|
| 4,879,519 A | 11/1989 | Myer | 330/149 |
| 4,978,873 A | 12/1990 | Shoemaker | 307/498 |
| 5,023,565 A | 6/1991 | Lieu | 330/151 |
| 5,115,409 A | 5/1992 | Stepp | 364/841 |
| 5,119,040 A | 6/1992 | Long et al. | 330/140 |
| 5,130,663 A | 7/1992 | Tattersall, Jr. | 330/52 |
| 5,323,119 A | 6/1994 | Powell et al. | 330/151 |
| 5,325,095 A | 6/1994 | Vadnais et al. | 342/22 |
| 5,414,383 A | 5/1995 | Cusdin et al. | 329/304 |
| 5,477,187 A | 12/1995 | Kobayashi et al. | 330/52 |
| 5,485,120 A | 1/1996 | Anvari | 330/151 |
| 5,491,454 A | 2/1996 | Matz | 330/149 |
| 5,528,196 A | 6/1996 | Baskin et al. | 330/151 |
| 5,594,385 A | 1/1997 | Anvari | 330/149 |
| 5,610,554 A | 3/1997 | Anvari | 330/52 |
| 5,617,061 A | 4/1997 | Fukuchi | 330/151 |
| 5,621,354 A | 4/1997 | Mitzlaff | 330/52 |
| 5,691,668 A | 11/1997 | Yoshikawa et al. | 330/151 |
| 5,760,646 A | 6/1998 | Belcher et al. | 330/149 |
| 5,808,512 A | 9/1998 | Bainvoll et al. | 330/151 |
| 5,809,400 A | 9/1998 | Abramsky et al. | 455/63 |
| 5,831,478 A | 11/1998 | Long | 330/52 |
| 5,862,459 A | 1/1999 | Charas | 455/114 |
| 5,877,653 A | 3/1999 | Kim | 330/149 |
| 5,892,397 A | 4/1999 | Belcher et al. | 330/149 |
| 5,907,798 A | 5/1999 | Abramsky et al. | 455/249.1 |
| 5,909,645 A | 6/1999 | Abramsky et al. | 455/249.1 |
| 5,912,586 A | 6/1999 | Mitzlaff | 330/149 |
| 5,923,214 A | 7/1999 | Mitzlaff | 330/52 |
| 5,933,766 A | 8/1999 | Dent | 455/103 |
| 5,970,053 A * | 10/1999 | Schick et al. | 370/252 |
| 5,986,499 A | 11/1999 | Myer | 330/52 |
| 6,047,177 A * | 4/2000 | Wickman | 455/422.1 |
| 6,052,023 A | 4/2000 | Myer | 330/2 |
| 6,075,411 A | 6/2000 | Briffa et al. | 330/149 |
| 6,091,715 A | 7/2000 | Vucetic et al. | 370/277 |
| 6,118,339 A | 9/2000 | Gentzler et al. | 330/149 |
| 6,125,266 A | 9/2000 | Matero et al. | 455/126 |
| 6,144,255 A | 11/2000 | Patel et al. | 330/151 |
| 6,148,185 A | 11/2000 | Maruyama et al. | 455/115 |
| 6,154,641 A | 11/2000 | Zhang | 455/112 |
| 6,175,747 B1 * | 1/2001 | Tanishima et al. | 455/562.1 |
| 6,400,223 B1 * | 6/2002 | McLaren | 330/151 |
| 6,674,324 B1 | 1/2004 | Ocenasek et al. | 330/52 |

FOREIGN PATENT DOCUMENTS

| | | |
|---|---|---|
| EP | 0 998 026 A1 | 5/2000 |
| EP | 0 948 131 B1 | 3/2002 |
| WO | WO 97/08822 | 3/1997 |

* cited by examiner

SCANNING RECEIVER FOR USE IN POWER AMPLIFIER LINEARIZATION

CROSS-REFERENCE TO RELATED APPLICATIONS

This application is a divisional of U.S. patent application Ser. No. 10/090,977, filed on Mar. 5, 2002 now abandoned by Thomas A. Bachmann, II et al., which claims the benefit of U.S. Provisional Patent Application Ser. No. 60/273,659, filed Mar. 6, 2001 by Thomas A. Bachman, II et al., which applications are incorporated by reference herein.

FIELD OF THE INVENTION

This invention relates generally to radio frequency (RF) power amplifiers, and more particularly to power amplifiers incorporating a linearization scheme, e.g., feed forward multi-carrier power amplifiers (MCPA's) that attempt to reduce or eliminate intermodulation distortion (IMD) products.

BACKGROUND OF THE INVENTION

Ideally, RF power amplifiers would act linearly, faithfully reproducing an amplified RF signal at their output with no distortion. Requirements for efficiency, however, can lead to operating amplifiers close to saturation, where non-linearities create unwanted IMD. IMD products may cause interference, disrupting the proper transmission and reception of RF signals, particularly in adjacent channels. Numerous techniques have been developed to reduce IMD products from amplified RF signals, including feed forward, predistortion, and linear amplification with non-linear components (LINC).

Recent surges in demand for wireless solutions have led to new frequency bands to increase capacity, such as, for example, the Universal Mobile Telecommunications System (UMTS) developed by the European Telecommunications Standard Institute for delivering 3G (third generation) services. Modern transmission protocols, such as UMTS, demand high linearity to prevent radio frequency energy in one band from spilling over and interfering with other proximate channels, but often have high Peak-to-Average Power Ratio (PAR) carrier signals that make efficient linear amplifiers difficult to design. This energy leakage can undesirably degrade the signal-to-noise (SNR) ratio or bit-error rate (BER) of the proximate frequency channels.

In practice, it is very difficult and often unnecessary to eliminate completely all IMD products for a selected center frequency. A certain tolerable level of IMD products is acceptable. When the terms "eliminate" or "reduce" are used herein with reference to the IMD products, it is understood that the IMD products should be suppressed below a certain tolerable level, even though they may not be entirely eliminated.

One common technique to reduce IMD to acceptable levels is feed forward correction, whereby the IMD products are isolated and manipulated so that at the final summing point the IMD products substantially cancel out. However, the input signal pattern can be unpredictable, often making the IMD products difficult to locate. One way to address this problem is to inject an artificial signal, conventionally called a pilot tone or pilot signal, to simulate the unwanted distortion to be removed. At the output, a pilot signal receiver detects the simulated distortion, and the amplifier is aligned in accordance with a signal representative of the pilot signal receiver output. Significantly, these pilot signal receivers do not detect and measure the actual non-linear distortion components. Instead, they detect and measure the simulated distortion based on an injected pilot signal so that, at the final summing point, the simulated distortion is canceled out with the intent that IMD will also cancel out, leaving only the amplified carrier signals.

Some pilot tone systems inject the pilot signal into the main signal before the carriers are amplified; others inject the pilot signal after the carriers have been amplified. In either case, the distortion products contain "artificial" distortion products in addition to the non-linear distortion products created by the power amplifier. As a result pilot tone systems suffer from several drawbacks. First, pilot tone systems do not actually detect and eliminate the actual distortion produced by the power amplifier. Because they detect distortion created by an artificially injected signal and not the actual distortion created by the power amplifier, the actual distortion may not be entirely cancelled and the artificial distortion may leak into the output. Moreover, circuit complexity, size, and cost are increased because the pilot tone circuit must include a pilot signal generator, and a pilot signal injector, among other things. In addition, the pilot signal receiver may need to be tightly synchronized with the transmitter to obtain optimum cancellation of the distortion products generated by the pilot signal and the power amplifier.

In another technique, the locations of the distortion products can be calculated without the use of a pilot tone or signal. In one such technique, an amplified WCDMA carrier containing both in-band frequency components and undesired spectral regrowth components is downconverted to baseband, digitized by an analog-to-digital converter, and then spectrally analyzed in a digital signal processor (DSP) to locate the carrier frequency and to determine the locations of the undesired distortion components. However, this approach is often undesirable because the DSP and related circuitry increase the overall cost and complexity of the power amplifier.

Therefore, a need exists for a power amplifier that incorporates an IMD detector circuit that is relatively simple in design and that can be manufactured at a relatively low cost.

BRIEF DESCRIPTION OF THE DRAWINGS

The invention and further objectives and advantages thereof may best be understood by reference to the following description taken in conjunction with the accompanying drawings, in which.

DETAILED DESCRIPTION

Although the invention will be described next in connection with certain embodiments, it will be understood that the invention is not limited to those particular embodiments. On the contrary, the description of the invention is intended to cover all alternatives, modifications, and equivalent arrangements as may be included within the spirit and scope of the invention as defined by the appended claims.

The present invention relates to a method and apparatus for locating and suppressing intermodulation distortion (IMD) products in a power amplifier system. In the embodiments described hereinafter, IMD products are suppressed in a feed forward multi-carrier power amplifier system. However, as will become apparent below, the principles of the invention may apply to single-carrier power amplifier systems, as well as to power amplifier systems incorporating other linearization schemes, e.g., predistortion amplifiers, Envelope Elimination and Restoration (EER) amplifiers, and various LINC amplifier designs, etc. Implementation of the herein-described techniques for suppressing IMD products within the context of other linearization schemes would be well within the abilities of one of ordinary skill in the art having the benefit of the instant disclosure.

As used herein, IMD products refer to the distortion products created by carrier signals. In the illustrated embodiment, a main signal path and a feed forward path receive a multi-carrier communications signal typically including multiple RF signals, which are located in a frequency band having a stationary constant channel configuration. In a specific aspect of the present invention, the communication protocol is UMTS. The RF signals are amplified by a main amplifier on the main signal path to produce amplified RF signals and creating undesired IMD products. The amplified RF signals and undesired IMD products are coupled to a scanning receiver. The scanning receiver typically includes a frequency synthesizer, a mixer, a filter, and a detector. A processor connected to the scanning receiver tunes the frequency synthesizer to a desired location, and the log detector outputs a signal representative of the power in a portion of the frequency band based on a local oscillator signal from the frequency synthesizer.

The power signal output by the scanning receiver may be used to either scan for active channels, or to drive an error correction loop in the feed forward amplifier system to optimally suppress IMD products. An active channel is a channel that contains an RF signal at its carrier frequency.

When the scanning receiver is used to scan for active channels, at least one portion of a frequency band is typically identified as being likely to include IMD products based upon the active channels that are identified during scanning. IMD product suppression can then be directed to the identified portion of the frequency band.

Figure 1:
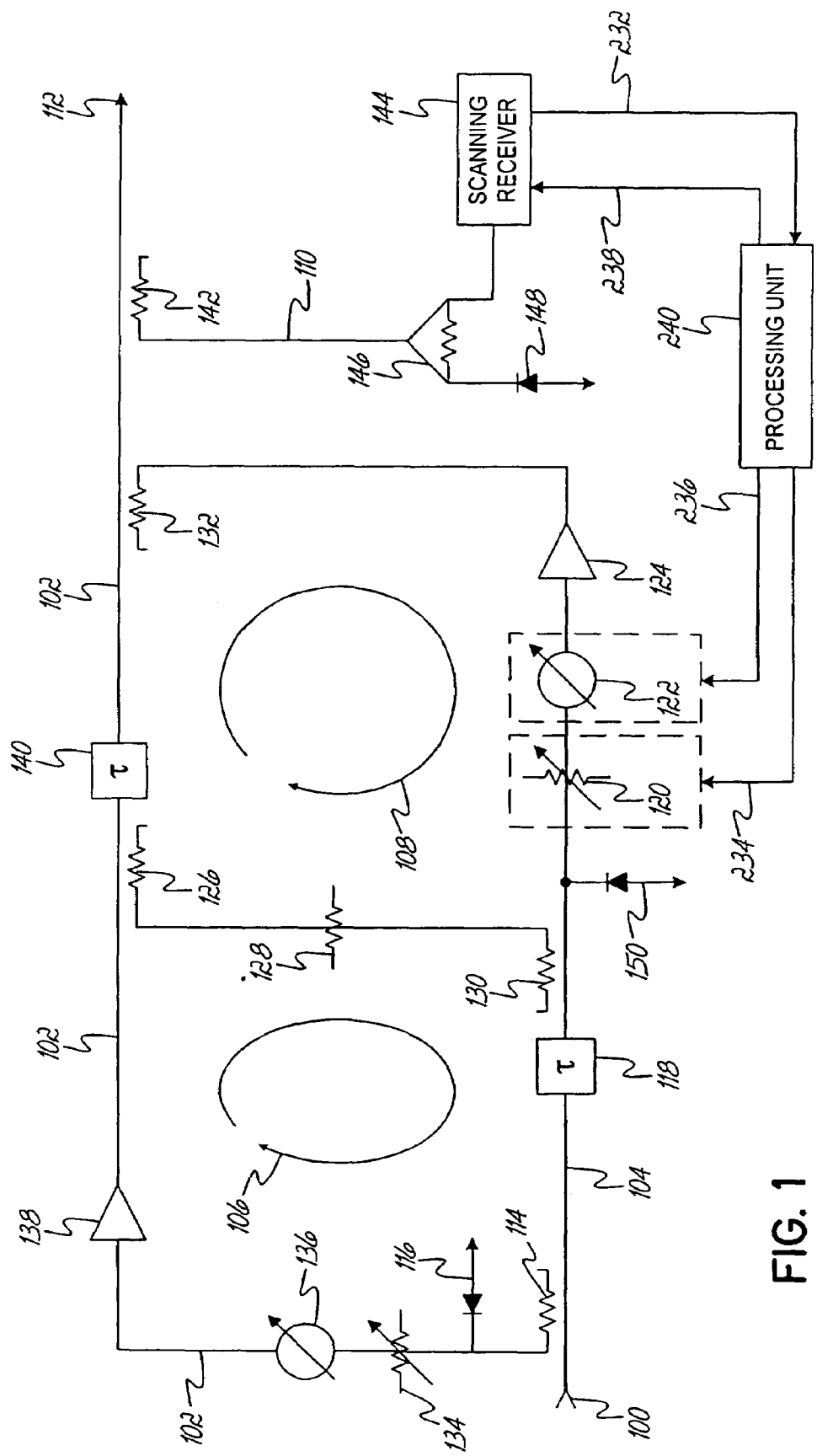
FIG. 1 is a functional diagram of a feed forward multi-carrier power amplifier circuit in accordance with one aspect of the present invention.

FIG. 1 shows a functional diagram of a typical feed forward multi-carrier power amplifier (MCPA) circuit with a correction circuit that includes a control circuit and a scanning receiver 144. It should be understood that feed forward circuits are well known in the art, and that the feed forward circuit shown in FIG. 1 is merely exemplary and that numerous variations of the feed forward circuit provided in FIG. 1 could be employed without departing from the spirit and scope of the present invention. According to one aspect of the present invention, the typical circuit generally includes an input 100, a main signal path 102, a feed forward path 104, and an output 112. The circuit further includes a carrier correction loop (CCL) 106, an error correction loop (ECL) 108, and a scanning receiver path 110. On the feed forward path 104, there is provided a feed forward delay filter 118, a feed forward attenuator 120, a feed forward phase shifter 122, and a feed forward amplifier 124. On the main signal path 102, there is provided a main attenuator 134, a main phase shifter 136, a main amplifier 138, and a main delay filter 140. Note that the feed forward attenuator 120 and feed forward phase shifter 122 may be incorporated into the feed forward amplifier 124, and the gain and phase of the feed forward amplifier 124 may be controlled by gain and phase control lines (not shown). Similarly, the main attenuator 134 and main phase shifter 136 may be incorporated into the main amplifier 138.

The input 100 receives radio frequency (RF) carrier signals (also collectively referred to herein as a multi-carrier communications signal), and an input carrier coupler 114 couples the RF carrier signals onto both the main signal path 102 and the feed forward path 104. Alternatively, a splitter (not shown) may be used to provide the RF carrier signals onto the main signal path 102 and the feed forward path 104. The RF carrier signals lie in any frequency band which has a constant channel configuration, i.e., where each channel has a non-varying carrier frequency and a slow varying average power. An example of a frequency band having a constant channel configuration is UMTS, though other frequency bands may have constant channel frequency configurations. The present invention contemplates any frequency band that has a constant channel configuration as described herein.

The UMTS frequency band is 60 MHz wide, spanning the 2110–2170 MHz frequency range, where each channel has a bandwidth of 5 MHz. Up to four channels may be active simultaneously subject to restrictions on center frequencies detailed in the UMTS specification. A channel is active when RF signals are present at its carrier frequency. In the UMTS band, the carrier frequency is located in the center of the channel. Furthermore, users are added in a Code Division Multiple Access (CDMA) configuration, setting up an input signal to the power amp that is stationary in frequency and maintained between power levels. This constant (non-varying) input arrangement facilitates the use of the input signal to drive the Error Correction Loop (ECL), and often replacing the need for an injected pilot tone configuration. Other modulation formats are expressly contemplated by the present invention, so long as they are operable in a frequency band having a constant channel configuration such as UMTS.

Referring again to FIG. 1, the RF carrier signals on the main signal path 102 may be attenuated by the main attenuator 134 and phase shifted by the main phase shifter 136, but not necessarily in that order. Optionally, a CCL power detector 150 may be provided on the feed forward path 104 to monitor the power level of the signals after the carriers have been subtracted from the CCL 106. Control of the main attenuator 134 and the phase shifter 136 may be under microprocessor control or any other suitable interface capable of monitoring the input power detector 116 and adjusting the main attenuator 134 and the phase shifter 136 in accordance with the output of the CCL power detector 150. The voltage from the CCL power detector 150 may be used to adjust the main attenuator 134 and the phase shifter 136 on the main signal path 102 to obtain maximum carrier cancellation out of the CCL 106.

Optionally, an input power detector 116 may be provided on the main signal path 102 to monitor the input power levels. For example, if the power level of a carrier signal exceeds a desired threshold, the input power detector 116 may be used to trigger an error condition, such as a reset or power down.

After the RF carrier signals have been attenuated and phase shifted, they are amplified by the main amplifier 138 to generate a multi-carrier output signal. For efficiency, the main amplifier 138 should be driven as close to saturation as possible, while maintaining necessary headroom for the high PAR. As a result, the main amplifier 138 produces amplified RF carrier signals and undesired IMD products. If the RF carriers, for example, lie in adjacent frequency channels, the IMD products from one frequency channel may spill over into other frequency channels. This effect becomes more pronounced the closer the main amplifier 138 is driven to saturation.

Next, the amplified RF carrier signals and undesired IMD products are time delayed by the main delay filter 140 to produce delayed amplified RF carrier signals and delayed amplified IMD products on the main signal path. Note that other suitable delay elements may be used to time-delay signals. The time delay is selected such that the amplified RF carrier signals and associated IMD products appear in the main signal path 102 at substantially the same time the adjusted carrier signals and associated IMD products from the feed forward amplifier 124 are coupled onto the main signal path 102.

Meanwhile, on the feed forward path 104, a feed forward delay filter 118 delays the RF carrier signals such that the RF carrier signals appear in the feed forward path 104 at substantially the same time the attenuated sample of the amplified RF carrier signals (and associated IMD products) are coupled onto the feed forward path 104 by a feed forward CCL coupler 130.

The carrier correction loop (CCL) 106 couples the amplified RF carrier signals and associated IMD products on the main signal path 102 onto the feed forward path 104 at the output of the feed forward delay filter 118. The CCL 106 includes (1) a main CCL coupler 126 which couples the amplified RF carrier signals and associated IMD products on the main signal path 102 onto the CCL 106, (2) a CCL attenuator 128 for attenuating the amplitude of the coupled signals, and (3) a feed forward CCL coupler 130 which couples the amplified RF carrier signals and undesired IMD products onto the feed forward path 104 at the output of the feed forward delay filter 118. The phase of the amplified RF carrier signals should be inverted with respect to the phase of the delayed (input sample) RF carrier signals on the feed forward path after the feed forward delay filter 118.

The CCL attenuator 128 attenuates the coupled signals such that the amplitude of the amplified RF carrier signals is substantially equal to the amplitude of the delayed (input sample) RF carrier signals on the feed forward path, in order to obtain maximum carrier cancellation. Attenuation resulting from the main CCL coupler 126 and the feed forward CCL coupler 130, as well as the gain of the main amplifier 138, should be taken into consideration when selecting the attenuation factor for the CCL attenuator 128. After coupling by the feed forward CCL coupler 130, the two out-of-phase carrier signals cancel each other such that primarily isolated IMD products remain on the feed forward path 104, though some level of carrier products may also be present. These isolated IMD products are adjusted in magnitude and phase with respect to the amplified IMD products at the output of the main amplifier 138, so that the two signals will cancel each other when combined.

Figure 2:
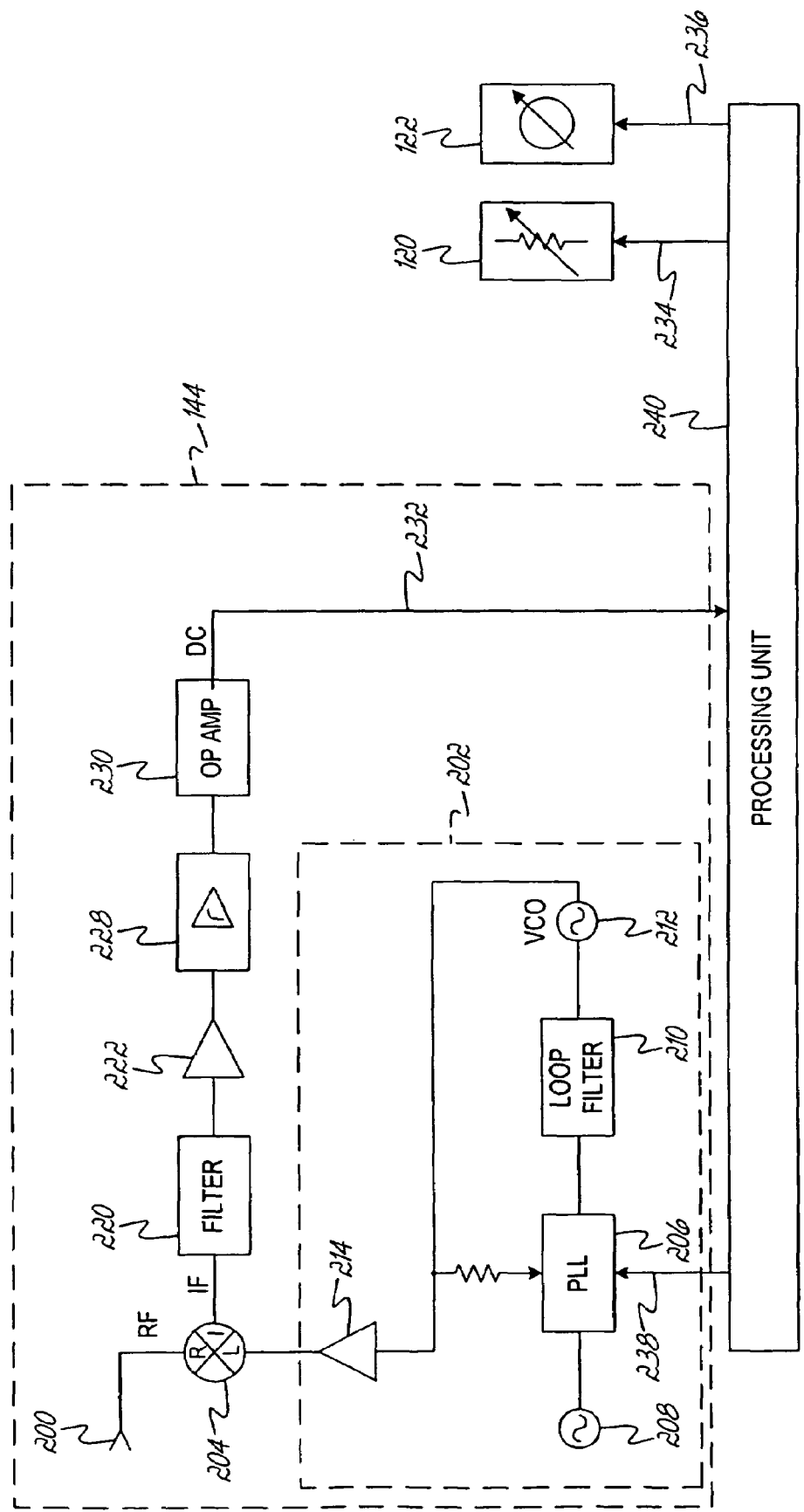
FIG. 2 is a functional diagram of a scanning receiver in accordance with one aspect of the present invention.

The isolated IMD products are presented to the feed forward attenuator 120, the feed forward phase shifter 122, and the feed forward amplifier 124. Note that the feed forward attenuator 120 and feed forward phase shifter 122 may be incorporated into the feed forward amplifier 124. The amplitude of the isolated IMD products may be attenuated by the feed forward attenuator 120, and the phase of the isolated IMD products may be shifted by the feed forward phase shifter 122, but not necessarily in that order. The feed forward attenuator 120 and feed forward phase shifter 122 are under the control of a processing unit 240 as shown in FIG. 2, as will be explained in more detail later. The processing unit 240 could be comprised of more than one unit. For example, the processing unit 240 could include a scanning mode unit and a correction mode unit, where the scanning mode unit locates carrier activity across the frequency band, and where the correction mode unit drives the error correction loop 106 to suppress the undesired IMD products on the main signal path 102. These units may be comprised of any combination of analog and/or digital devices, such as an analog processor and/or a microprocessor.

The attenuated and phase-shifted IMD products are amplified by a feed forward amplifier 124 to generate a suppression signal. The gain of the feed forward amplifier 124 is selected such that the IMD products are substantially eliminated at the output 112. The feed forward amplifier 124 is typically driven well below saturation to avoid creating non-linear distortion products in the ECL 108.

The feed forward amplifier 124 produces amplified IMD products whose phase is inverted with respect to the phase of the delayed amplified IMD products on the main signal path 102. The amplitudes of the amplified IMD products and the delayed amplified IMD products are substantially identical. Because they are also phase inverted, when they are coupled by the main ECL coupler 132 onto the main signal path 102, the amplified IMD products and the delayed amplified IMD products substantially cancel each other so that IMD products are essentially eliminated from the main signal supplied to the main output 112.

The resultant amplified RF carrier signals (and their associated IMD products, if any) are coupled onto a scanning receiver loop 110 by a scanning receiver coupler 142. Optionally, a splitter 146 may provide the amplified RF carrier signals to both the scanning receiver 144 and to an output power detector 148. The scanning receiver 144 produces an output voltage at the scanning receiver input control 232 connected to the processing unit shown in FIG. 2. Optionally, the output power detector 148 detects the power of the amplified RF signals. For example, the output power detector 148 may monitor the output power of the main amplifier 138 for abnormalities, and trigger a fault isolation loop when, for example, too much power is detected.

Referring now to FIG. 2, there is shown a functional diagram of the scanning receiver 144. The scanning receiver 144 generally includes a scanning receiver input 200, a mixer 204, a frequency synthesizer 202, and a scanning receiver input control 232. In one embodiment, the frequency synthesizer 202 is a direct digital synthesizer, though other frequency synthesizers could be employed. In one embodiment, the frequency synthesizer 202 includes a phase-locked loop (PLL) synthesizer 206, a reference oscillator 208, a loop filter 210, and a voltage controlled oscillator (VCO) 212. The PLL synthesizer 206 is driven by the highly stable reference oscillator 208, which optionally may be a temperature controlled crystal oscillator (TCXO), so that the VCO 212 will hold its assigned frequency over wide temperature gradients. In one aspect of the present invention, the reference oscillator 208 oscillates at 10 MHz, but other frequencies may be employed depending on the PLL synthesizer 206 design specifications, and other considerations. The loop filter 210 is connected between the PLL synthesizer 206 and VCO 212 and cleans the PLL synthesizer 206 output to prevent rippling or modulation of the VCO 212. The loop filter 210 may be selected in accordance with design specifications such as bandwidth, phase margin, lock time, settling time, and loop order. For example, in one embodiment, the loop filter 210 is a third order filter with a bandwidth of 10–20 kHz.

The output of the VCO 212 may be optionally provided to an LO amplifier 214, which amplifies the output of the VCO 212 to a range necessary to drive the LO input of the mixer 204. For example, in one embodiment, the mixer 204 may be a Hittite HMC175MS8 mixer, which has a typical LO drive level of 13 dBm. However, it is understood that any other suitable mixer or frequency converter could be used. The mixer 204 downconverts a portion of the frequency band based on a known frequency from the VCO 212 to an intermediate frequency (IF). In one embodiment where the carriers lie in a UMTS band, the IF frequency is 246 MHz. It is expressly understood that any other suitable IF frequency could be selected. For example, to detect the power of a portion of the frequency band around 2115 MHz, the VCO would be tuned to provide an LO of 2115 MHz±246 MHz.

An IF filter 220 passes only a selected portion of the IF signals and produces passed IF signals. In one embodiment, the IF filter 220 is a SAW bandpass filter having a pass bandwidth of 300 kHz centered around 246 MHz. It should be understood that the IF filter 220 can be any type of filter, and those of ordinary skill will appreciate that the type and number of filters will be driven by considerations such as over what range RF signal activity is to be measured, over what range IMDs are to be cancelled, and other considerations.

An IF amplifier 222 compensates for insertion loss and sets the drive level into a log detector 228. In one embodiment, two filtering and gain stages are provided to achieve high selectability (i.e., ability to resolve low power signals in the presence of high level carriers) and to compensate for insertion loss. Thus, in one embodiment, the IF filter 220 includes two SAW (surface acoustic wave) band pas filters having a pass bandwidth of 300 kHz centered around 246 MHz and further includes two amplifiers to compensate for insertion loss through the SAW band pass filters. It is understood that other filtering and gain stage combinations may be employed without departing from the spirit and scope of the present invention.

Next, the filtered IF signals are converted to a voltage representative of a characteristic (e.g., the voltage, dBV or power, dBm or dBW) of the IF signal by the log detector 228. Note that the input characteristic of a detector is sometimes expressed as voltage (dBv), but may also be expressed in terms of power (dBm or dBW). In one embodiment, the log detector 228 is a high dynamic range demodulating logarithmic amplifier such as an Analog Devices AD8310, though any other suitable detector may be employed. In one embodiment, peak detection using a capacitor (not shown) may be used to remove the a/c components from the output of the log detector 228.

Optionally, the output voltage from the log detector 228 may be provided to an operational amplifier (op amp) 230 for scaling and signal conditioning, if desired. According to one aspect of the present invention, the op amp 230 may be configured as a buffer, gain stage or a 1-pole or 2-pole active low pass filter for best closed-loop performance. It should be understood, though, that the use of the op amp 230 is optional, and certain design requirements may not require filtering or scaling of the output voltage from the log detector 228.

Finally, the scanning receiver input control (or power signal) 232 is a voltage (DC volts) representative of the power (expressed in dBV or dBm) of a portion (determined by the IF filter 220) of the frequency band (UMTS in one embodiment). The scanning receiver input control 232 is provided as an input to the processing unit 240 as shown in FIG. 2. Alternative representations of power may be utilized for control 232, e.g., current, a digital value, etc.

The processing unit 240 includes all necessary (at least four) control lines: an attenuator output control 234, a phase shifter output control 236, a PLL output control 238, and a scanning receiver input control 232. The scanning receiver input control 232 to the processing unit 240 is connected to the scanning receiver 144 shown in FIG. 1. The PLL output control 238 to the processing unit 240 is connected to the PLL synthesizer 206. The attenuator output control 234 is connected to the feed forward attenuator 120, and the phase shifter output control 236 is connected to the feed forward phase shifter 122 shown in FIG. 2.

Still referring to FIG. 2, the processing unit 240 has two modes of operation: a scanning mode and a correction mode. In the scanning mode, which may occur at power up (i.e. when power is supplied to the circuit) or at regular intervals during operation, the processing unit 240 determines which channels of the frequency band are active. In the correction mode, the processing unit 240 calculates a first location of IMD products based on the carrier frequencies in the channels found to be active in the scanning mode, then tunes the PLL synthesizer 206 to the first location plus the desired IF, and, responsive to the voltage developed on line 232 by the scanning receiver 144, adjusts the feed forward attenuator 120 and feed forward phase shifter 122 until the IMD products in the main signal path are optimally suppressed.

Figure 3:
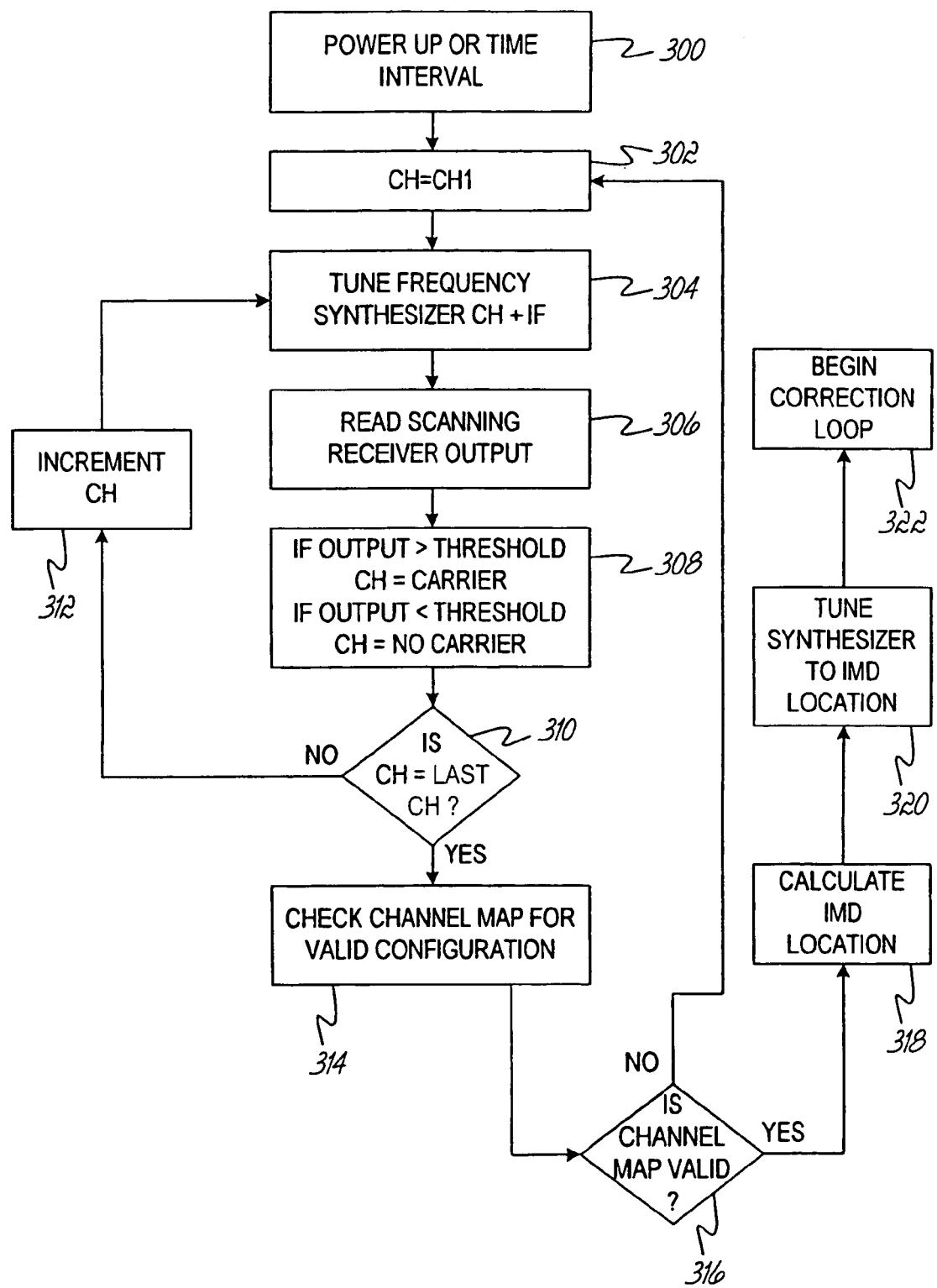
FIG. 3 is a diagrammatic flow chart of a channel scan algorithm in accordance with one aspect of the present invention.

FIG. 3 is a diagrammatic flow chart of the scanning mode in accordance with one embodiment of the present invention. In the scanning mode, the processing unit 240 "hops" across the channels to determine which are active. In other words, the processing unit 240 need not incrementally sweep or step across the entire channel. Rather, because the channel configuration is constant, the processing unit 240 may be instructed to hop from one carrier frequency to another, skipping frequencies in between. The channel hopping procedure described herein is discussed next.

First, at power up, or at some regular time interval during normal operation (300), the processing unit 240 tunes the PLL synthesizer 206 to drive the VCO 212 to the center frequency of the first channel (CH=CH1) (302) plus a predetermined IF frequency (304). In the UMTS frequency band, the bandwidth for transmission is 2110 MHz–2170 MHz. In one embodiment, the IF frequency is 246 MHz, though any other suitable IF frequency may be desired. After tuning the VCO 212, the scanning receiver 144 produces an output voltage which is provided to the processing unit 240 by scanning receiver input control 232 (306).

In one aspect of the present invention, the processing unit 240 compares the output voltage from scanning receiver input control 232 to a threshold (308). If the voltage exceeds the threshold, then the channel represented by CH is deemed to be active (308). Otherwise, the channel represented by CH is deemed to be not active (308). In one embodiment, the output voltage is digitized by, for example, an analog-to-digital converter (not shown), and the value representative of the digitized voltage is compared against a threshold digital value. The result of the comparison from the channel under consideration is stored in a memory device such as a RAM, or any other suitable device. The active-channel threshold may be fixed or variable. Next, the processing unit 240 checks whether the channel being analyzed is the last channel in the frequency band (310). If the last channel is not present, the processing unit 240 calculates the next center frequency (312), and (304 through (310) are repeated until the last channel is scanned.

The UMTS Specification has restrictions on multi-carrier frequency locations, such that when one is found, rather than sweeping the scanning receiver 144 across the entire channel in incremental steps, the processing unit 240 may hop ahead to the next center frequency. Because the channel configuration is constant, the locations of the carrier frequencies are known a priori, obviating the need to scan across the entire channel.

When the last channel is scanned, the processing unit 240 optionally may determine whether the channel map is a valid configuration (314). If the channel map is not valid (316), the processing unit 240 may rescan for active carriers (302). By way of example only, the channel map in accordance with the UMTS band is not valid if carrier activity is detected in more than four channels. Whatever the frequency band, the processing unit 240 determines whether the detected carrier patterns conform with the requirements of that particular frequency band. In one embodiment, the processing unit 240 compares the comparison results (active or not active) of each visited channel stored in memory against a predetermined channel map configuration stored in memory, for example. Alternatively, the processing unit 240 executes a sequence of instructions to determine whether the channel map is valid.

Once the scanning mode is complete, and, if performed, the channel map is found to be valid, the processing unit 240 next enters a correction mode to locate the IMD products and to suppress them (318).

These calculations may be performed by the processing unit 240 or by a separate unit (not shown) connected to the processing unit 240, as explained earlier. One advantage of the present invention is that it provides a versatile voltage from the scanning receiver 144 representative of the power in a selected portion of the frequency band. It is expressly understood that there are numerous ways to use the output voltage to locate an active channel or to drive a correction loop. Those of ordinary skill will appreciate the flexibility the present invention offers by providing a voltage representative of the power in a portion of a frequency band, whether that portion comprises a carrier signal, IMD products, or no signal at all.

The IMD locations may be determined either by performing a calculation according to any number of algorithms, or they may be stored in a lookup table in a memory device, such as an EPROM or other suitable device. For example, the lookup table may contain combinations of active channels and IMD locations associated with each combination of active channels. The calculations may be based on the carrier frequencies of the active channels. For example, in one embodiment, to calculate IMD locations associated with two active channels, the spectral difference between the center frequencies of two active channels is taken, and then subtracted from the center frequency of the first active channel to obtain a first IMD location. Optionally, the spectral difference could also be added to the center frequency of the second active channel to obtain a second IMD location. For example, consider one UMTS channel is active with a center frequency at 2132.5 MHz, and a second channel is active with a center frequency of 2147.5 MHz. Subtracting the difference between these two center frequencies from 2132.5 yields a first IMD location of 2117.5 MHz. Adding this difference to 2147.5 yields a second IMD location of 2162.5 MHz. The IMD locations may be stored in a memory device, such as in the register memory of the processing unit 240, an EPROM device, or any other suitable device.

In an alternative embodiment, a lookup table indexed by carrier frequencies may be formed containing combinations of active channels and associated IMD locations. For the example above, at least two IMD locations are 2117.5 MHz and 2162.5 MHz. For active channels at 2112.5 and 2117.5 MHz, the IMD locations are 2107.5 MHz and 2122.5 MHz. Other or different locations may be optimally determined by analyzing where the IMD products appear when certain combinations of channels become active.

In some embodiments, e.g., in single-carrier environments, a scan of active channels by scanning receiver 144 may identify as few as one active channel. In such instances, the identification of an IMD location may be based upon the location of a single active channel.

The PLL synthesizer 206 tunes the VCO 212 to the first IMD location of 2117.5 MHz. A portion of the band centered about this frequency is selected by the IF filter 220, and the log detector 228 outputs a voltage representative of the power at this selected portion of the band. As the feed forward attenuator 120 and feed forward phase shifter 122 are optimized, the voltage representative of the power at a portion of the frequency centered about 2117.5 MHz should decrease until it falls below a predetermined threshold. During optimization, the power around the second IMD location may be measured. The attenuator 120 and phase shifter 122 may be adjusted, until the power at either location or both locations is reduced below a predetermined threshold.

In this fashion, the scanning receiver 144 may correct for the first IMD location only or for the second IMD location only or for both. In yet another embodiment, such as when two adjacent channels and third non-adjacent channel are active, a third IMD location which lies between the two adjacent channels and third non-adjacent channel may be calculated, and the scanning receiver 144 may hop from one IMD location to another to find an optimal setting for the feed forward attenuator 120 and feed forward phase shifter 122. For example, after optimizing one IMD location, it may be found that another IMD location has not been optimally suppressed. It may be necessary to "back off" the first IMD location so that both the IMD products at both first and second IMD locations are optimally suppressed. It is to be expressly understood that there are numerous ways of locating and eliminating the IMD locations without departing from the spirit and scope of the present invention. The goal is to suppress the undesired IMD products in the main signal path below an acceptable threshold. For certain combinations of active channels, it may be adequate to find one IMD location and optimize based only on the power detected at the first IMD location; in others it may be necessary to monitor the power at more than one IMD location by hopping from one to the other until the IMD products at both locations are optimally suppressed.

Returning now to FIG. 3, after the IMD locations are calculated (318), the processing unit 240 tunes the frequency synthesizer 202 to a frequency representative of an IMD location (320). The IMD products are optimally suppressed (322) by adjusting the feed forward attenuator 120 via attenuator output control 234, and by adjusting the feed forward phase shifter 122 via phase shifter output control 236 until the output voltage from the scanning receiver 144 falls below a desired threshold. In one embodiment, a gradient search or dither type (sample and step) algorithm is used to drive the feed forward attenuator 120 and feed forward phase shifter 122, though any other suitable algorithm may be used.

Figure 4:
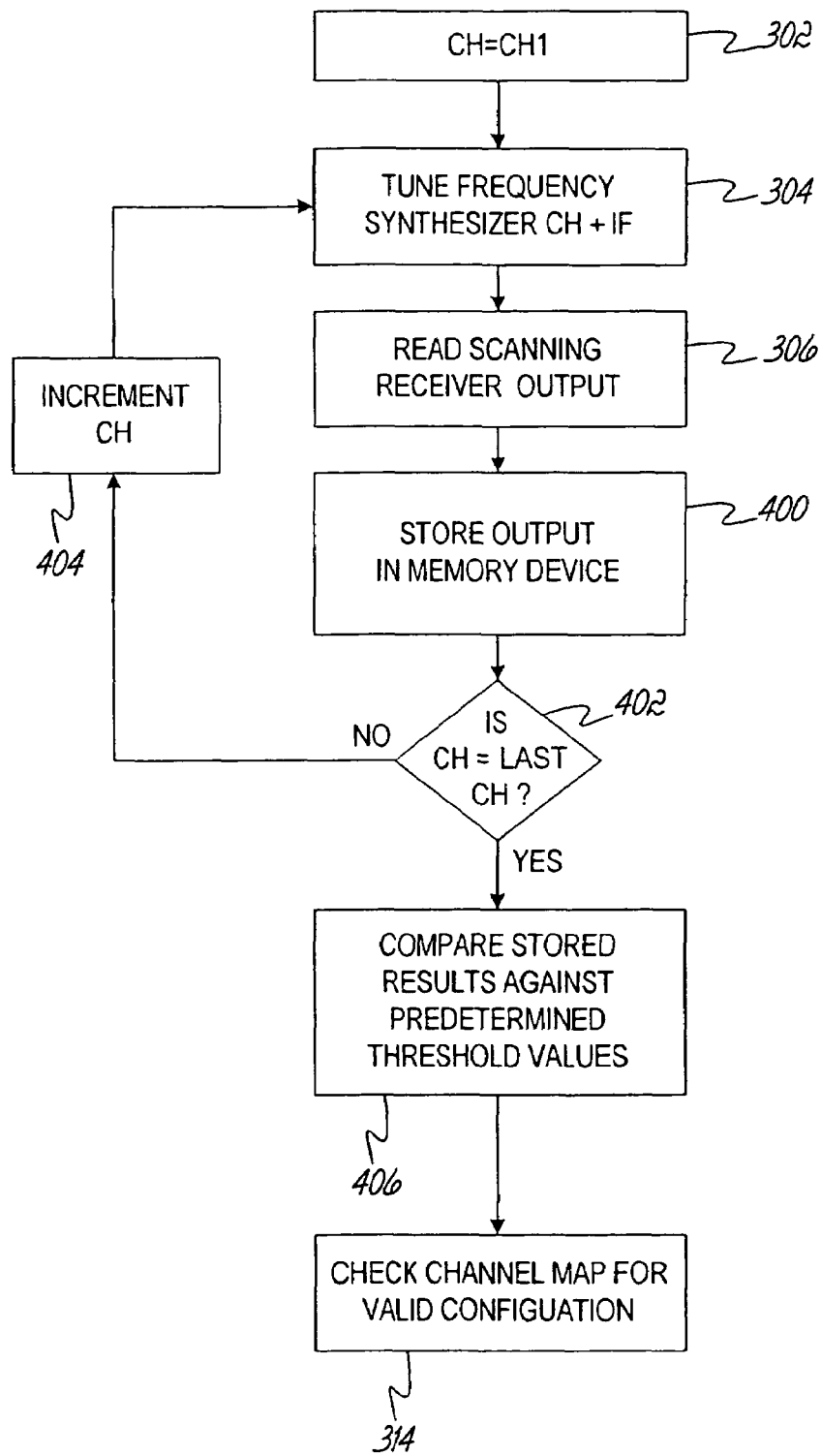
FIG. 4 is a diagrammatic flow chart of another channel scan algorithm in accordance with another aspect of the present invention.

FIG. 4 illustrates a diagrammatic flow chart of yet another scanning mode in accordance with another aspect of the present invention. Like before, at power up or at various time intervals during normal operation (300), the center frequency of the first channel is determined (302), and the frequency synthesizer 202 is tuned to the first channel's center frequency CH+IF (304). Next, the scanning receiver output voltage 232 is read (306), which represents the power detected in a portion of the band around the center frequency. A value representative of the voltage 232 is stored in a memory device (400), such as in RAM or any other suitable memory device. Next the scanning mode checks for whether the last channel in the frequency band has been scanned (402). If the last channel has not been scanned, the center frequency for the next channel is calculated (404), and the frequency synthesizer 202 is tuned to the next channel's center frequency+IF (304), and so forth.

In one aspect of the present invention, when all of the channels have been scanned, the stored results are compared against predetermined threshold values (406) by the processing unit 240. The predetermined threshold values may be identical for all channels or may represent different values for different channels. In other words, the power required for one channel to be active may be different from the power required for another channel to be active. In one embodiment, these threshold values are stored in a lookup table.

The processing unit 240 reads the stored value representing whether a particular channel is active, and compares that value to the corresponding threshold value in the lookup table. If the stored value exceeds the threshold value, the representative channel is considered active.

Next, in one embodiment, the channel map configuration is checked for validity (314). In another embodiment, the validity check is not performed at all. Typically, the validity check is performed before the memory comparing step (406). If the channel map is not a valid configuration, the channel scan is repeated (302). Otherwise, the correction begins, and the processing unit 240 calculates the location of IMD products associated with an active channel (318), tunes the frequency synthesizer 202 to a frequency representative of a first location of IMD products (320), and drives the error correction loop elements (322) until the IMD products are optimally suppressed.

Still with reference to FIG. 4, in another aspect of the present invention, the comparison step (406) may be performed after the storing step (400). In other words, the scanning loop (304, 306, 400, 402, 404) need not complete before the status of each channel is determined. The voltage (or value) representative of the power of each channel under consideration may be compared with a threshold voltage (or value if the voltage is digitized) by a comparator for example immediately after the voltage is received from the scanning receiver 144 via the scanning receiver input control 232. In this situation, no memory devices are typically needed to store the detected voltages from the scanning receiver 144. Rather, the detected voltages compared to a threshold voltage immediately after detection by the scanning receiver 144, and the result of this comparison may be stored in a memory device as a value representative of the comparison result (such as a logical 0 if the channel is not active, or a logical 1 if the channel is active). Values representative of a threshold voltage may be stored, for example, in a lookup table in an EPROM or other suitable memory device.

In another aspect of the invention the carriers can be suppressed at the ECL input 130 (FIG. 1) based on IMD cancellation. In other words, the CCL attenuator 134 (FIG. 1) and CCL phase shifter 136 (FIG. 1) can be varied for best IMD cancellation, instead of best carrier cancellation, assuming stable operation of the power amplifier can be maintained.

Various other modifications may be made to the herein-described embodiments without departing from the spirit and scope of the invention. For example, a scanning receiver may be used in connection with linearization techniques other than feed forward correction (e.g., predistortion) to suppress any IMD products identified as a result of the identification of one or more active channels by the scanning receiver. Also, it will be appreciated that a wide variety of alternate circuit arrangements, including various alternate electronic components, layouts and the like, may be used consistent with the invention. Therefore, the invention lies in the claims hereinafter appended.

What is claimed is:

1. A power amplifier, comprising:
 (a) an amplifier circuit disposed in a main signal path and configured to amplify an RF input signal disposed in a frequency band to generate an RF output signal;
 (b) a scanning receiver coupled to the main signal path and configured to monitor power on the signal path in a controlled portion of the frequency band; and
 (c) a control circuit disposed in a feed forward path and configured to generate a suppression signal that, when combined with the RF output signal, suppresses intermodulation distortion (IMD) products disposed in a selected portion of the frequency band, the control circuit configured to, in a first mode, control the scanning receiver to identify at least one active channel among a plurality of channels in the frequency band, and, in a second mode, to control the scanning receiver to monitor IMD products in the selected portion of the frequency band, wherein the selected portion of the frequency band is associated with the active channel(s) identified by the scanning receiver.

2. The power amplifier of claim 1, wherein the control circuit is configured to identify each active channel by detecting an active signal at a carrier frequency associated with such active channel.

3. The power amplifier of claim 1, wherein the control circuit is configured to sequentially tune the scanning receiver to each of a plurality of carrier frequencies, compare the power signal output by the scanning receiver at each carrier frequency to a threshold, and identify an active channel among the plurality of channels based upon the comparison of the power signal output by the scanning receiver when tuned to a carrier frequency associated with such active channel to the threshold.

4. The power amplifier of claim 1, wherein the RF input signal comprises a multi-carrier communications signal.

5. The power amplifier of claim 1, wherein the at least one active channel includes first and second channels respectively associated with first and second carrier frequencies, and wherein the control circuit is configured to determine the selected portion of the frequency band by performing a calculation selected from the group consisting of subtracting a spectral distance between the first and second carrier frequencies from the first carrier frequency and adding the spectral distance between the first and second carrier frequencies to the second carrier frequency.

6. The power amplifier of claim 1, wherein the at least one active channel includes first and second channels, wherein the first and second channels are respectively associated with first and second carrier frequencies, and wherein the control circuit is configured to determine the selected portion of the frequency band by accessing a lookup table indexed by the first and second carrier frequencies.

7. A power amplifier, comprising:
(a) an amplifier circuit disposed in a main signal path and configured to amplify an RF input signal disposed in a frequency band to generate an RF output signal;
(b) a scanning receiver coupled to the main signal path and configured to detect an output level of the RF output signal in a selected portion of the frequency band; and
(c) a control circuit coupled to receive the detected output level from the scanning receiver, the control circuit further configured to control the scanning receiver to select as the selected portion of the frequency band each of a plurality of channels in the frequency band so as to generate a power signal representative of an output level of the RF output signal in each of the plurality of channels.

8. A circuit arrangement for use in a feed forward, multi-carrier power amplifier system to suppress intermodulation distortion (IMD) products from an RF communications signal, the circuit arrangement comprising:
(a) a mixer for downconverting an RF carrier signal to an intermediate frequency (IF) signal, wherein the RF carrier signal is disposed at a channel among a plurality of channels in a frequency band, each channel associated with a carrier frequency;
(b) a filter responsive to the IF signal and configured to pass only a predetermined portion of the IF signal;
(c) a detector responsive to the predetermined portion of the IF signal passed by the filter, the detector configured to generate a power signal representative of the power of the portion of the IF signal passed by the filter; and
(d) a processing unit configured to generate a suppression signal that suppresses IMD products from the RF communications signal responsive to the power signal.

9. The circuit arrangement of claim 8, wherein the filter comprises a SAW bandpass filter.

10. The circuit arrangement of claim 8, wherein the detector comprises a log detector.

11. The circuit arrangement of claim 8, wherein the processing unit comprises a lookup table identifying at least one IMD location associated with at least first and second carrier frequencies located in at least first and second channels.

12. The circuit arrangement of claim 8, wherein the RF communications signal is modulated according to one of a WCDMA and CDMA modulation format.

* * * * *